(12) United States Patent
Kimura

(10) Patent No.: US 7,576,526 B2
(45) Date of Patent: Aug. 18, 2009

(54) OVERCURRENT DETECTION CIRCUIT

(75) Inventor: Hiroyuki Kimura, Sendai (JP)

(73) Assignee: Freescale Semiconductor, Inc, Austin, TX (US)

( * ) Notice: Subject to any disclaimer, the term of this patent is extended or adjusted under 35 U.S.C. 154(b) by 113 days.

(21) Appl. No.: 12/014,809

(22) Filed: Jan. 16, 2008

(65) Prior Publication Data

US 2009/0179621 A1    Jul. 16, 2009

(51) Int. Cl.
  *G05F 1/573*    (2006.01)
(52) U.S. Cl. .......................... 323/277; 323/315; 363/73
(58) Field of Classification Search ......... 323/312–316, 323/274, 275, 276, 277; 363/73
  See application file for complete search history.

(56) References Cited

U.S. PATENT DOCUMENTS 5,705,913 A * 1/1998 Takeuchi et al. ............ 320/134
6,300,878 B1 * 10/2001 Galloway et al. ........... 340/642
6,816,017 B2 * 11/2004 Yamashita et al. .......... 330/298
2009/0021227 A1 * 1/2009 Sase et al. .................... 323/238
2009/0102445 A1 * 4/2009 Ito et al. ...................... 323/283

FOREIGN PATENT DOCUMENTS

| JP | 6311734 A | 11/1994 |
|---|---|---|
| JP | 2003224968 A | 8/2003 |
| JP | 2005333691 A | 12/2005 |

* cited by examiner

*Primary Examiner*—Jessica Han
(74) *Attorney, Agent, or Firm*—Charles Bergere

(57) ABSTRACT

A circuit for detecting overcurrent flowing to an output transistor. A replica transistor generates a reference voltage that is in accordance with a reference current flowing from a constant current circuit. A voltage-current conversion circuit generates a determination reference current proportional to the reference current based on the reference voltage. A current-voltage conversion circuit converts the determination reference current to a determination reference voltage. A detector detects overcurrent flowing to the output transistor based on the determination reference voltage.

18 Claims, 6 Drawing Sheets

OVERCURRENT DETECTION CIRCUIT

BACKGROUND OF THE INVENTION

The present invention relates to an overcurrent detection circuit, and more specifically, to an overcurrent detection circuit for use in a power supply circuit for a DC-DC converter or the like.

In the prior art, a power supply circuit for a DC-DC converter or the like drives an output transistor to control current that is supplied to a load. Normally, a power supply circuit includes an overcurrent detection circuit to detect overcurrent flowing to the output transistor and protect the power supply circuit from the overcurrent.

Japanese Laid-Open Patent Publication No. 2003-224968 describes a differential amplifier 1 that detects overcurrent flowing to a switching element M1 (output transistor) based on a reference voltage source V1 (see FIG. 1 of the publication). Japanese Laid-Open Patent Publication No. 6-311734 discloses a comparator 56 for detecting overcurrent flowing to a switch element M14 (output transistor) by comparing an output voltage of a current detector 49 with a reference voltage Vref (refer to FIG. 1 of the publication).

However, the prior art circuits do not take into consideration on-resistance variations of an output transistor caused by temperature or manufacturing process factors. In Japanese Laid-Open Patent Publication No. 2003-224968, the differential amplifier 1 cannot accurately detect the overcurrent flowing to the switching element M1 if the on-resistance of the switching element M1 deviates from a designated value due to temperature or manufacturing process factors. Similarly, in Japanese Laid-Open Patent Publication No. 6-311734, the comparator 56 may not be able to accurately detect overcurrent due to variations in the on-resistance of the switch element M14.

Accordingly, Japanese Laid-Open Patent Publication No. 2005-333691 discloses an overcurrent detection circuit 14 for detecting the overcurrent irrespective of variations in the on-resistance of a power MOS transistor 2, which functions as an output transistor (refer to FIG. 1 of the publication). The overcurrent detection circuit 14 generates a reference current that is dependent on the on-resistance of the power MOS transistor 2 with a detection MOS transistor 3, which is formed on the same chip as the power MOS transistor 2, and a constant current circuit 4, which is connected to the detection MOS transistor 3. This prevents detection errors that would be caused by variations in the on-resistance of the power MOS transistor 2.

However, in the circuit disclosed in Japanese Laid-Open Patent Publication No. 2005-333691, a reference current generation circuit (detection MOS transistor 3 and constant current circuit 4) is always detecting overcurrent value. In a power supply circuit incorporating a plurality of DC-DC converters that generate different power supplies as in a multi-channel DC-DC converter, each DC-DC converter requires a reference current generation circuit that is in correspondence with the overcurrent value that is to be detected. This increases power consumption and enlarges the chip area. In the circuit disclosed in Japanese Laid-Open Patent Publication No. 2005-333691, only one level of overcurrent value can be detected. Thus, a single reference current generation circuit cannot detect multiple overcurrent levels.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
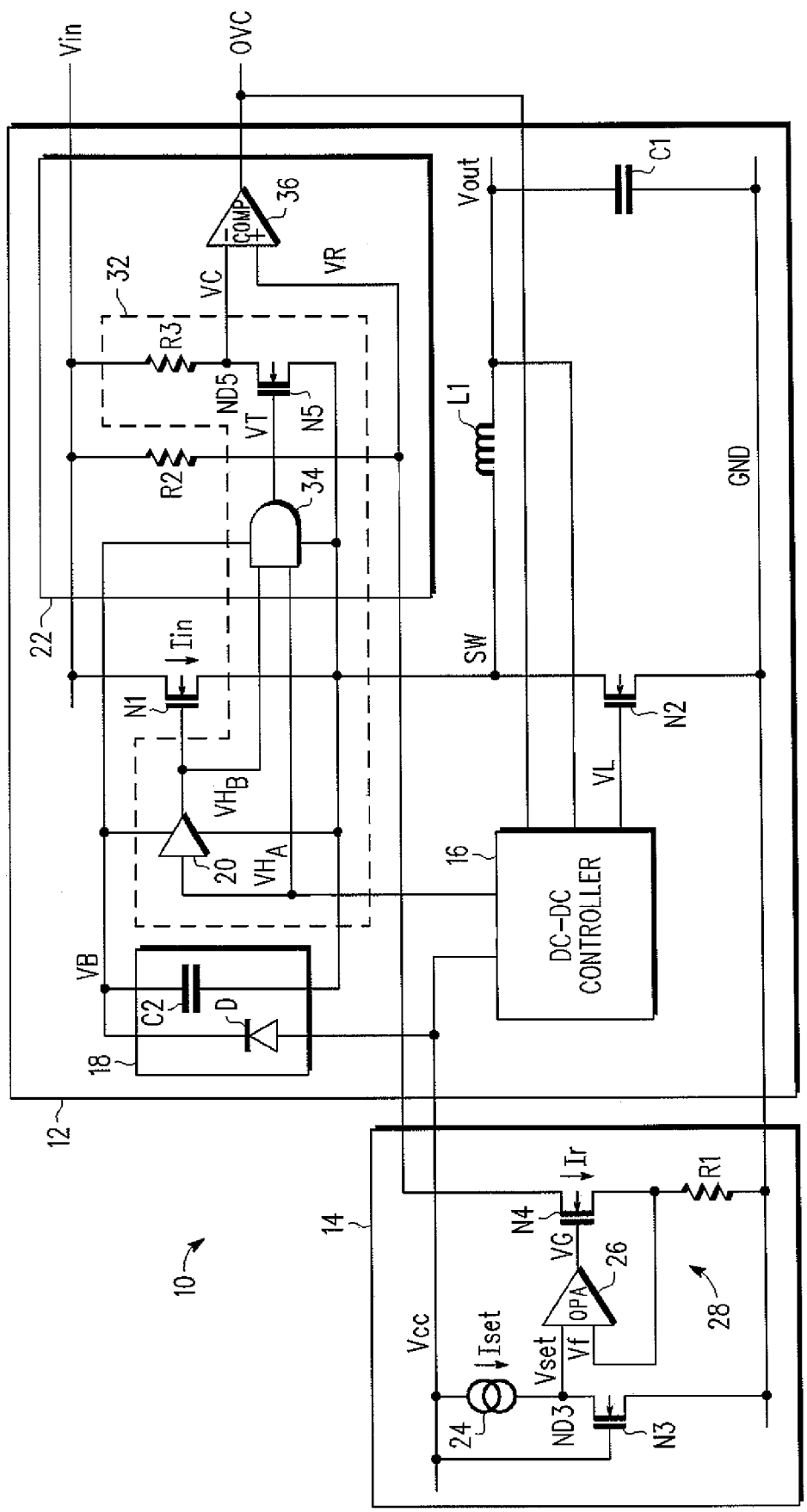
FIG. 1 is a schematic circuit diagram of an overcurrent detection circuit according to one embodiment of the present invention.

In the drawings, like numerals are used for like elements throughout.

The present invention provides an overcurrent detection circuit that suppresses power consumption and chip area enlargement even when detecting multiple levels of overcurrent while preventing variations in the on-resistance of an output transistor from lowering the detection accuracy.

A first aspect of the present invention is an overcurrent detection circuit for detecting overcurrent flowing to an output transistor. The overcurrent detection circuit includes a constant current circuit for generating a reference current. A replica transistor, connected to the constant current circuit, generates a reference voltage that is in accordance with the reference current. A voltage-current conversion circuit, connected to the constant current circuit and the replica transistor, generates a determination reference current that is proportional to the reference current based on the reference voltage. A current-voltage conversion circuit, connected to the voltage-current conversion circuit, converts the determination reference current to a determination reference voltage. A detector, connected to the current-voltage conversion circuit, detects the overcurrent flowing to the output transistor based on the determination reference voltage.

A second aspect of the present invention is a power supply circuit including a first side transistor. A second side transistor is connected in series to the first side transistor. A DC-DC controller generates first and second drive signals that drive the first and second side transistors in a complementary manner. A constant current circuit generates a reference current. A replica transistor, connected to the constant current circuit, generates a reference voltage that is in accordance with the reference current. A voltage-current conversion circuit, connected to the constant current circuit and the replica transistor, generates a determination reference current proportional to the reference current based on the reference voltage. A first side current-voltage conversion circuit, connected to the voltage-current conversion circuit, converts the determination reference current to a first side reference voltage. A first side detector, connected to the first side current-voltage conversion circuit, detects current flowing to the first side transistor based on the first side reference voltage.

A third aspect of the present invention is a multi-channel DC-DC converter including a reference current generation circuit for generating a determination reference current. A current mirror circuit, connected to the reference current generation circuit, generates a plurality of determination reference currents proportional to the determination reference current. A plurality of DC-DC converters are connected to the current mirror circuit. The reference current generation circuit includes a constant current circuit for generating a reference current. A replica transistor, connected to the constant current circuit, generates a reference voltage that is in accordance with the reference current. A voltage-current conversion circuit, connected to the constant current circuit and the replica transistor, generates a determination reference current that is proportional to the reference current based on the reference voltage. The plurality of DC-DC converters each include an output transistor and a detection unit for detecting current flowing to the output transistor. The detection unit includes a current-voltage conversion circuit, connected to the current mirror circuit, for converting one of the plurality of determination reference currents to a determination reference voltage. A detector, connected to the current-voltage conversion circuit, detects overcurrent flowing to the output transistor based on the determination reference voltage.

Other aspects and advantages of the present invention will become apparent from the following description, taken in conjunction with the accompanying drawings, illustrating by way of example the principles of the invention.

An overcurrent detection circuit according to the present invention will now be described with reference to the drawings.

FIG. 1 is a schematic circuit diagram of a power supply circuit 10 incorporating an overcurrent detection circuit according to a preferred embodiment of the present invention. The power supply circuit 10 includes a DC-DC converter 12 and a reference current generation circuit 14. The DC-DC converter 12, which is a step-down DC-DC converter, includes a first output transistor (first side transistor) N1, a second output transistor (second side transistor) N2, a DC-DC controller 16, a boot strap circuit 18, a buffer (delay circuit) 20, and a detection unit 22. In the preferred embodiment, an overcurrent detection circuit is formed by the reference current generation circuit 14, the detection unit 22, and the buffer (delay circuit) 20. The detection unit 22 detects the overcurrent flowing to the first output transistor N1.

The transistors N1 and N2 are each formed by an N-channel MOS transistor. The source of the transistor N2 is connected to ground GND, and the drain of the transistor N2 is connected to the source of the transistor N1. The drain of the transistor N1 is connected to a power supply wiring for supplying an input voltage Vin. That is, the transistors N1 and N2 are connected in series between the input power supply and ground GND.

A node SW between the transistors N1 and N2 is connected to a first terminal of a choke coil L1. The choke coil L1 has a second terminal connected to the ground GND via a smoothing capacitor C1. An output voltage Vout is output from a node between the coil L1 and the capacitor C1 in accordance with the current energy stored in the coil L1.

The DC-DC controller 16 is connected to the gate of the first output transistor N1 via the buffer (delay circuit) 20. The DC-DC controller 16 generates and provides a first drive signal $VH_A$ to the buffer 20. The buffer 20 buffers and delays the first drive signal $VH_A$ to generate and provide a first delayed drive signal $VH_B$ to the gate of the first output transistor N1. The buffer 20 may be arranged in the DC-DC controller 16. The DC-DC controller 16 provides a second drive signal VL to the gate of the second output transistor N2.

The DC-DC controller 16 generates first and second drive signals $VH_A$ and VL to drive the first and second output transistors N1 and N2 in a complementary manner. When the first output transistor N1 is activated by the first delayed drive signal $VH_B$ and the second output transistor N2 is deactivated by the second drive signal VL, current Iin corresponding to the input voltage Vin flows to the first output transistor N1. This stores energy (current) in the coil L1 and increases the output voltage Vout.

When the first output transistor N1 is deactivated by the first delayed drive signal $VH_B$, and the second output transistor N2 is activated by the second drive signal VL, the energy stored in the coil L1 is discharged through a loop formed by the second output transistor N2, the coil L1, and the capacitor C1. This decreases the output voltage Vout. The DC-DC controller 16 receives the output voltage Vout as a feedback voltage and controls the duty of the first and second output transistors N1 and N2 in accordance with the feedback voltage to keep the output voltage Vout constant.

The boot strap circuit 18, which is connected to the buffer 20, generates an operation voltage VB for the buffer 20 to drive the first output transistor N1. More specifically, the DC-DC controller 16 generates the first and second drive signals $VH_A$ and VL based on an operation voltage Vcc. In this case, the buffer 20 must supply the gate of the first output transistor N1 with drive voltage that is higher by the voltage Vcc than the source potential (i.e., potential of node SW) of the first output transistor N1.

The boot strap circuit 18 is formed by a diode D and a capacitor C2. The anode of the diode D is supplied with the operation voltage Vcc, and a cathode of the diode D is connected to a first electrode of the capacitor C2. The first electrode of the capacitor C2 is connected to a first power supply terminal of the buffer 20. The capacitor C2 has a second electrode connected to a second power supply terminal of the buffer 20 and to the node SW of the transistors N1 and N2. The boot strap circuit 18 charges the capacitor C2 in correspondence with the voltage Vcc while the second output transistor N2 is activated. This increases the potential of the operation voltage VB to be higher than the potential at the node SW by voltage Vcc. Therefore, when driving the first output transistor N1, the buffer 20 generates the first delayed drive signal $VH_B$ based on the operation voltage VB (VB=Vcc+SW) generated by the boot strap circuit 18 and the potential at the node SW.

The reference current generation circuit 14 will now be described.

The reference current generation circuit 14 includes a constant current circuit 24, a replica transistor N3, an operational amplifier 26, a current control transistor N4, and a first resistor circuit R1.

The replica transistor N3, which is formed on the same chip as the first output transistor N1, is an N-channel MOS transistor and is of the same conductance type as the first output transistor N1. The replica transistor N3 is much smaller than the first output transistor N1 and is, for example, 1/100 the size of the first output transistor N1.

The source of the replica transistor N3 is connected to the ground GND, and the drain is connected via the constant current circuit 24 to the power supply wiring for supplying the operation voltage Vcc. The operation voltage Vcc is applied to the gate of the replica transistor N3. Accordingly, the transistor N3 is constantly activated by the operation voltage Vcc.

The gate-source voltage VGS3 of the replica transistor N3 is expressed as "Vcc−GND". When the first output transistor N1 is activated, the gate-source voltage VGS1 of the first output transistor N1 is expressed as "VB−SW". As described above, the operation voltage VB is set to "Vcc+SW". Therefore, the gate-source voltage VGS1 of the first output transistor N1 and the gate-source voltage VGS3 of the replica transistor N3 are substantially equal to each other. The relationship between the element size and the on-resistance is expressed by the next equation.

$$ron1 * S_{N1} = ron3 * S_{N3} \quad \text{Equation 1}$$

In the above equation, "$S_{N1}$" is the element size of the first output transistor N1, "ron1" is the on-resistance thereof, "$S_{N3}$" is the element size of the replica transistor N3, and "ron3" is the on-resistance thereof.

The constant current circuit 24 supplies the reference current Iset, which is a constant current, to the replica transistor N3. The replica transistor N3 generates a reference voltage Vset at a node ND3 between the transistor N3 and the constant current circuit 24 based on the reference current Iset and its on-resistance ron3. The reference voltage Vset corresponds to a source-drain voltage VDS3 of the replica transistor N3 and is expressed by the next equation:

$$Vset = VDS3 = Iset * ron3 \quad \text{Equation 2}$$

The operational amplifier 26 includes a first input terminal for receiving the reference voltage Vset, a second input terminal for receiving a feedback voltage Vf, and an output terminal. The output terminal of the operational amplifier 26 is connected to the gate of the current control transistor N4, which is formed by an N-channel MOS transistor. The source of the transistor N4 is connected to the ground GND via the first resistor circuit R1. A node between the transistor N4 and the first resistor circuit R1 is connected to the second input terminal of the operational amplifier 26. The first resistor circuit R1 is a resistor element having a first resistance element r1. In the preferred embodiment, the operational amplifier 26, the current control transistor N4, and the first resistor circuit R1 form a voltage-current conversion circuit 28. The voltage-current conversion circuit 28 is not limited to the configuration shown in FIG. 1.

The operational amplifier 26 generates a control voltage VG for driving the transistor N4 based on a differential input value of the reference voltage Vset and the feedback voltage Vf. When the transistor N4 is driven, current Ir flows through a path extending through the transistor N4 and the first resistor circuit R1. Accordingly, the feedback voltage Vf expressed by the next equation is supplied to the second input terminal of the operational amplifier 26.

$$Vf = Ir * r1 \quad \text{Equation 3}$$

The operational amplifier 26 generates control voltage VG so that the feedback voltage Vf (equation 3) supplied to the second input terminal becomes equal to the reference voltage Vset (equation 2) supplied to the first input terminal. The reference current generation circuit 14 thus generates the current (determination reference current) Ir expressed by the next equation.

$$Ir = Iset * (ron3/r1) \quad \text{Equation 4}$$

In other words, the reference current generation circuit 14 generates the determination reference current Ir, which is dependent on the on-resistance r1 of the first resistor circuit R1 and the on-resistance ron3 of the replica transistor N3 and which is proportional to the reference current Iset. In equation 4, the on-resistance ron3 of the replica transistor N3 changes in accordance with the variation in on-resistance ron1 of the first output transistor N1. Accordingly, the determination reference current Ir is substantially determined by the resistance r1 of the first resistor circuit R1.

The detection unit 22 will now be described.

The detection unit 22 includes a second resistor circuit (current-voltage conversion circuit) R2, an AND gate (logic gate) 34, a switch circuit N5, a pull-up circuit (voltage stabilizing circuit) R3, and a comparator (detector) 36. In the preferred embodiment, the AND gate 34, the switch circuit N5, the pull-up circuit R3, and the buffer 20 form a timing control circuit 32.

The second resistor circuit R2 is a resistor element having a second resistance r2. The input voltage Vin is applied to a first terminal of the second resistor circuit R2. The second resistor circuit R2 has a second terminal, which is connected to the drain of the current control transistor N4 in the reference current generation circuit 14, and is connected to a non-inversion input terminal of the comparator 36.

The second resistor circuit R2 converts the determination reference current Ir generated by the reference current generation circuit 14 to a voltage (determination reference voltage) VR corresponding to the second resistance r2. The determination reference voltage VR is used to detect overcurrent Iovc flowing to the first output transistor N1. In such a state, a voltage drop caused by the second resistor circuit R2, that is, the voltage (Vin−VR) between the first and second terminals of the second resistor circuit R2 is expressed by the next equation.

$$Vin - VR = Ir * r2 \quad \text{Equation 5}$$

Equation 5 is converted to the following equation by substituting equation 4 to equation 5.

$$Vin - VR = Iset * (ron3 * r2/r1) \quad \text{Equation 6}$$

The AND gate 34 includes a first input terminal for receiving the first drive signal $VH_A$ generated by the DC-DC controller 16, a second input terminal for receiving the first delayed drive signal $VH_B$ generated by the buffer 20, and an output terminal. A first power supply terminal of the AND gate 34 is connected to a first electrode of the capacitor C2, and a second power supply terminal of the AND gate 34 is connected to a second electrode of the capacitor C2. The AND gate 34 performs a logical AND operation on the drive signal $VH_A$ and the delayed drive signal $VH_B$ to output a timing signal VT indicating the operation result.

The switch circuit N5 is formed by the N-channel MOS transistor. The gate of the transistor N5 is connected to the output terminal of the AND gate 34, and the source of the transistor N5 is connected to the source (i.e., node SW) of the first output transistor N1. The drain of the transistor N5 is connected to the pull-up circuit R3 and an inversion input terminal of the comparator 36. The pull-up circuit R3 is formed by a resistor element and serves as a pull-up resistor. The resistor element R3 has a first terminal to which the input voltage Vin is applied and a second terminal connected to the drain of the transistor N5.

The comparator 36 includes an inversion input terminal connected to a node ND5 between the resistor element R3 and the transistor N5, a non-inversion input terminal connected to the second terminal of the second resistor circuit R2, and an output terminal connected to the DC-DC controller 16. More specifically, the comparator 36, which receives the voltage output from the node ND5 between the resistor element R3 and the transistor N5 as the detection voltage VC, compares the detection voltage VC with the determination reference voltage VR output from the second terminal of the second resistor circuit R2. When the detection voltage VC is higher than the determination reference voltage VR, the comparator 36 outputs a determination signal OVC having a low level to the output terminal. When the detection voltage VC is lower than or equal to the determination reference voltage VR, the comparator 36 generates the determination signal OVC having a high level.

The operation of the detection unit 22 will now be discussed.

When the first drive signal $VH_A$ has a low level and the second drive signal VL has a high level, the second output transistor N2 is activated by the second drive signal VL. The buffer 20 generates the first delayed drive signal $VH_B$ at a low level when the first drive signal $VH_A$ has a low level. This deactivates the first output transistor N1. As a result, the potential at the node SW is substantially lowered to ground level. The AND gate 34 generates a timing signal VT at a low level with the logical AND operation result of the drive signal $VH_A$ having a low level and the delayed drive signal $VH_B$ having a low level. This deactivates the transistor N5. Thus, the potential (detection voltage VC) at the node ND5 is fixed to a predetermined potential (substantially input voltage Vin) by the pull-up circuit R3. In this case, the level of the detection voltage VC is higher than the level of the determination reference voltage VR. Therefore, the comparator 36 generates the determination signal OVC at a low level.

When the first drive signal $VH_A$ has a high level and the second drive signal VL has a low level, the second output transistor N2 is deactivated by the second drive signal VL. The buffer 20 generates the first delayed drive signal $VH_B$ at a high level when the first drive signal $VH_A$ has a high level. This activates the first output transistor N1. As a result, the potential at the node SW is pulled up from the ground level. The potential at the node SW changes in a manner dependent on the current Iin flowing through the transistor N1. The AND gate 34 performs a logical AND operation on the drive signal $VH_A$ having a high level and the delayed drive signal $VH_B$ having a high level and generates the timing signal VT having a high level. This activates the transistor N5. Thus, the detection voltage VC is output to the node ND5 at substantially the same level as the potential at the node SW. That is, when the first output transistor N1 is activated, the detection voltage VC changes in a manner dependent on the current Iin flowing through the transistor N1. The comparator 36 compares the detection voltage VC and the determination reference voltage VR to determine whether or not the current Iin flowing to the transistor N1 exceeds the level of the overcurrent Iovc.

When the first output transistor N1 is activated by the delayed drive signal $VH_B$, a source-drain voltage VDS1 (Vin-SW) of the first output transistor N1 is expressed by the next equation.

$$Vin-SW=VDS1=Iin*ron1 \qquad \text{Equation 7}$$

When the overcurrent Iovc flows to the first output transistor N1 (i.e., when Iin=Iovc is satisfied), the detection voltage VC and the determination reference voltage VR having the same value (i.e., VC=VR) are supplied to the comparator 36. In this case, the value of equation 6 and the value of equation 7 become equal and are expressed by the next equation.

$$Iset*(ron3*r2/r1)=Iovc*ron1 \qquad \text{Equation 8}$$

Equation 8 may be deformed to express the overcurrent Iovc with the next equation.

$$Iovc=Iset*(ron3/ron1)*(r2/r1) \qquad \text{Equation 9}$$

Furthermore, equation 9 may be converted to the next equation using equation 1.

$$Iovc=Iset*(S_{N1}/S_{N3})*(r2/r1) \qquad \text{Equation 10}$$

Accordingly, the comparator 36 detects the overcurrent Iovc expressed in equation 10 based on the determination reference voltage Ir. That is, the comparator 36 detects the overcurrent Iovc based on the determination reference voltage Ir determined by the reference current Iset, the element size $S_{N1}$ of the first output transistor N1, the element size $S_{N3}$ of the replica transistor N3, the first resistance r1, and the second resistance r2.

The operation of the timing control circuit 32 will now be discussed with reference to FIGS. 1 and 2.

The timing control circuit 32 controls the period during which the detection voltage VC is supplied to the comparator 36. More specifically, the timing control circuit 32 controls the activation and deactivation of the transistor N5 so that the detection voltage VC is supplied to the comparator 36 only when the first output transistor N1 is driven. That is, the timing control circuit 32 sets the timing for performing overcurrent detection with the comparator 36 to the period during which the first output transistor N1 is activated. In the preferred embodiment, the timing control is performed using the delay of the buffer 20.

Figure 2:
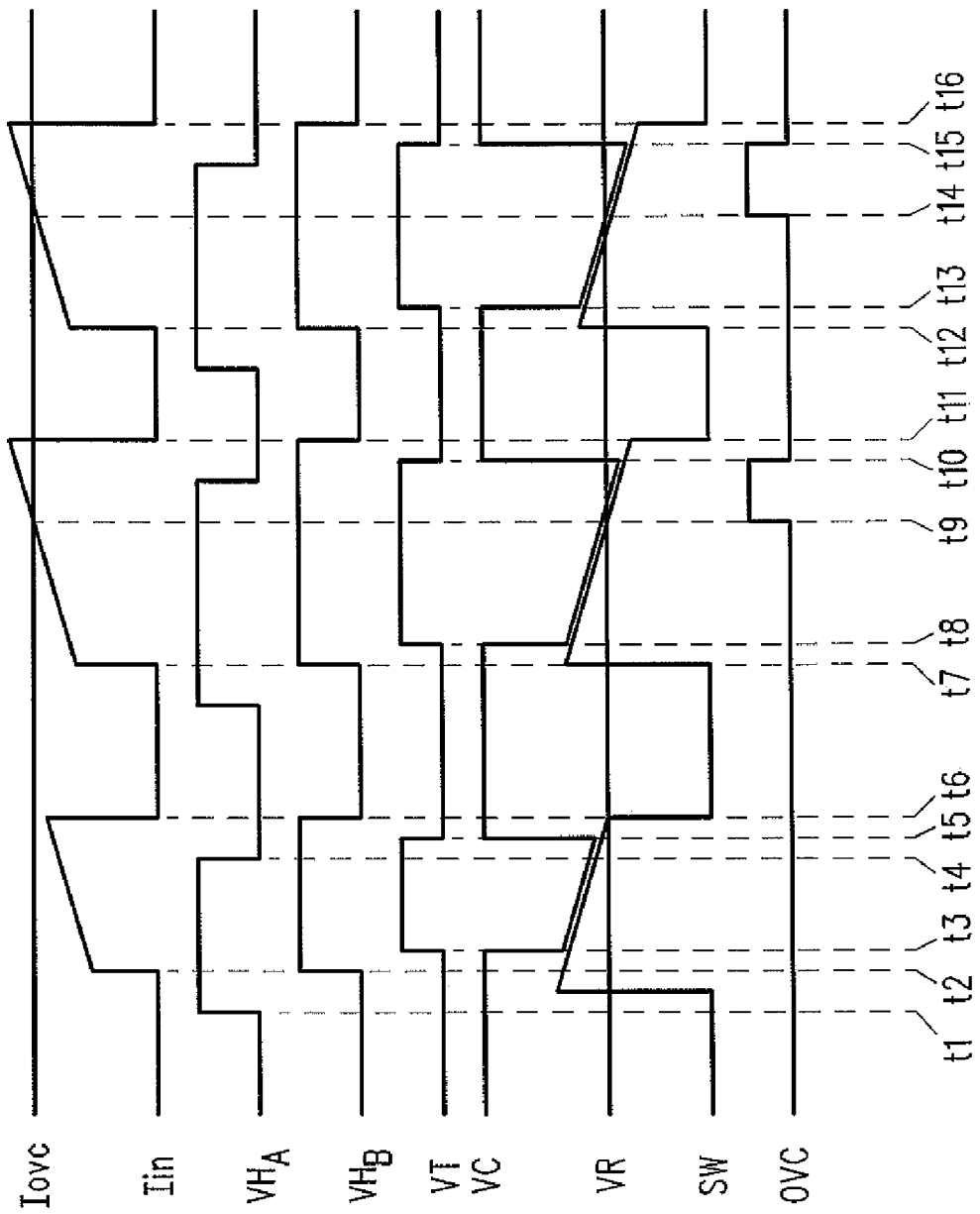
FIG. 2 is a schematic timing chart illustrating the operation of the overcurrent detection circuit shown in FIG. 1.

As shown in FIG. 2, the drive signal $VH_A$ rises at time t1. The buffer 20 delays the drive signal $VH_A$ having a high level and outputs the delayed drive signal $VH_B$ having a high level at time t2. The first output transistor N1 is then activated by the delayed drive signal $VH_B$ having a high level. As a result, the potential at the node SW rises due to the current Iin flowing to the transistor N1. The AND gate 34 performs a logical AND operation on the drive signal $VH_A$ and the delayed drive signal $VH_B$ and outputs the timing signal VT having a high level at time t3. The transistor (switch circuit) N5 is then activated by the timing signal VT having a high level. As a result, the detection voltage VC decreases in accordance with the potential (i.e., current Iin) at the node SW. This enables the comparator 36 to detect the overcurrent Iin flowing to the first output transistor N1. Thereafter, the drive signal $VH_A$ falls at time t4. The AND gate 34 outputs the timing signal VT having a low level at time t5 when the drive signal $VH_A$ has a low level. More specifically, the AND gate 34 lowers the timing signal VT to a low level before the buffer 20 delays the drive signal $VH_A$ having a low level and outputs the delayed drive signal $VH_B$ having a low level. Thus, the transistor N5 is deactivated when the first output transistor N1 is still activated. As a result, the detection voltage VC is fixed at a constant voltage (substantially input voltage vin) by the pull-up circuit R3. Thus, the comparator 36 cannot detect the overcurrent. Subsequently, the buffer 20 outputs the delayed drive signal $VH_B$ having a low level at time t6. Then, the delayed drive signal $VH_B$ having a low level deactivates the first output transistor N1.

In this manner, the AND gate 34 sets the activation period of the transistor N5 (t3-t5, t8-t10, t13-t15 in FIG. 2) during the activation period of the first output transistor N1 (t2-t6, t7-t11, t12-t16 in FIG. 2) using the delay of the buffer 20. The function of the comparator 36 (overcurrent detection) stops when the first output transistor N1 is deactivated. Specifically, the output of the comparator 36 is held at a constant voltage (L level) by the pull-up circuit R3 during the deactivation period of the first output transistor N1. This prevents the comparator 36 from performing erroneous detection.

The overcurrent detecting operation of the preferred embodiment will now be discussed with reference to FIG. 2.

As shown in FIG. 2, the delayed drive signal $VH_B$ rises at time t7 and activates the first output transistor N1. Then, the timing signal VT rises at time t8 and activates the transistor N5 of the detection unit 22. The comparator 36 starts the overcurrent detecting operation and compares the detection voltage VC and the determination reference voltage VR to determine whether or not the current Iin flowing to the first output transistor N1 is the overcurrent Iovc.

The current Iin reaches the level of the overcurrent Iovc at time t9. In this case, the level of the detection voltage VC is lower than or equal to the determination reference voltage VR. Therefore, the comparator 36 generates the determination signal OVC having a high level indicating that the overcurrent Iovc is flowing to the transistor N1. For instance, the DC-DC controller 16 generates the drive signal $VH_A$ having a low level when the determination signal OVC has a high level the transistor N1 is then deactivated by the delayed drive signal $VH_B$ having a low level provided from the buffer 20. Therefore, the transistor N1 is protected from the overcurrent Iovc.

The overcurrent detection circuit (14, 20, and 22) of the preferred embodiment has the advantages described below.

The replica transistor N3 of the reference current generation circuit 14 is formed to be much smaller than the first output transistor N1. As a result, the reference current generation circuit 14 is compact, and the power consumption of the reference current generation circuit 14 is reduced.

The second resistor circuit (current-voltage conversion circuit) R2 generates the determination reference voltage VR based on the determination reference current Ir generated by the reference current generation circuit 14. The second resistor circuit R2 is arranged in the detection unit 22 of the DC-DC converter 12. Therefore, the value of the determination reference voltage VR (i.e., overcurrent detection level) may be set by the second resistor circuit R2 of the DC-DC converter 12 without changing the configuration of the reference current generation circuit 14.

The timing control circuit 32 controls the operation of the comparator 36 so that the comparator 36 performs the overcurrent detection only during the period the first output transistor N1 is activated. More specifically, the timing control circuit 32 activates the transistor N5, supplies the comparator 36 with the detection voltage VC corresponding to the potential at the node SW, and deactivates the transistor N5 to generally fix the detection voltage at the input voltage Vin. This prevents the comparator 36 from performing erroneous detection when the transistor N is deactivated.

Figure 3:
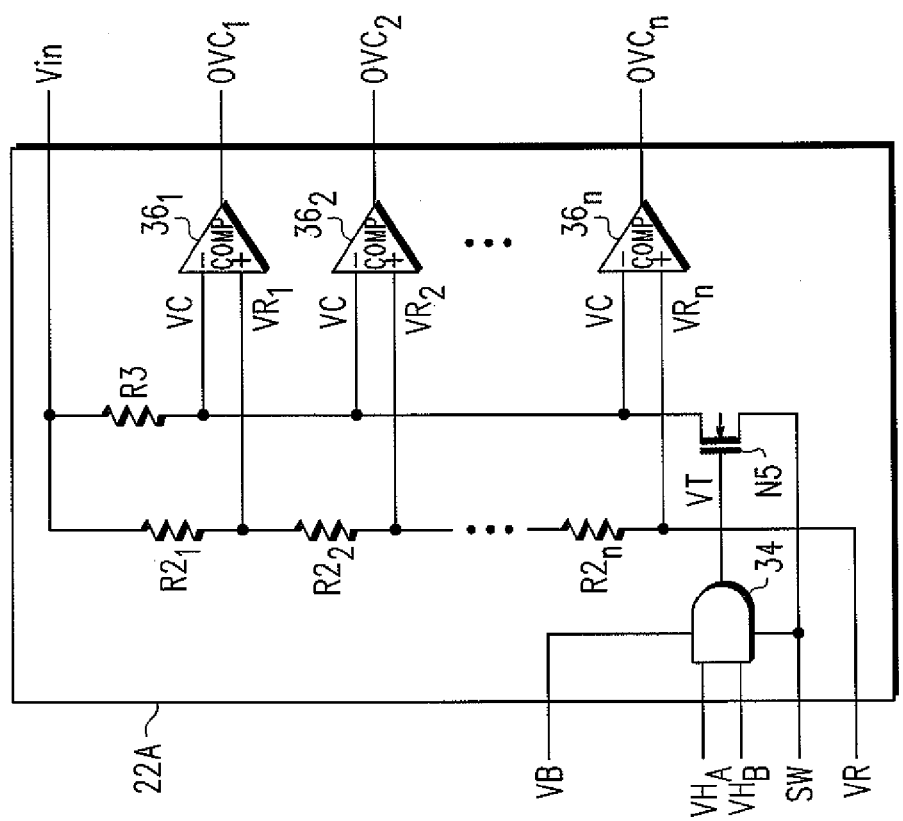
FIG. 3 is a schematic circuit diagram of another detection unit for detecting multiple levels of currents flowing to a first output transistor in the overcurrent detection circuit of FIG. 1.

FIG. 3 is a schematic circuit diagram of another detection unit 22A according to the present invention. The detection unit 22A may be used in place of the detection unit 22 of the DC-DC converter 12 of FIG. 1. In FIGS. 1 and 3, components denoted with the same reference numerals function in the same manner.

The detection unit 22A includes a plurality of resistor circuits (current-voltage conversion circuit) $R2_1$, $R2_2$, . . . , and $R2_n$ and a plurality of comparators (detectors) $36_1$, $36_2$, . . . , and $36_n$. The resistor circuits $R2_1$, $R2_2$, . . . , and $R2_n$, which are connected in series, serve as voltage dividing circuits for voltage dividing the voltage difference between the input voltage Vin and the determination reference voltage VR to generate a plurality of determination reference voltages $VR_1$, $VR_2$, . . . , and $VR_n$. The resistor circuits $R2_1$, $R2_2$, . . . , and $R2_n$ are each formed by, for example, a resistor element.

The comparator $36_1$ compares a determination reference voltage $VR_1$ generated at a node between the resistor circuit $R2_1$ and the resistor circuit $R2_2$ with the detection voltage VC to generate a determination signal $OVC_1$ indicating whether or not the current Iin flowing to the first output transistor N1 (FIG. 1) is greater than or equal to a current amount $A_1$.

The comparator $36_2$ compares a determination reference voltage $VR_2$ ($VR_2 < VR_1$), which is generated at a node between the resistor circuit $R2_2$ and the resistor circuit $R2_3$ (not shown), with the detection voltage VC to generate a determination signal $OVC_2$ indicating whether or not the current Iin flowing to the first output transistor N1 is greater than or equal to a current amount $A_2$ ($A_2 > A_1$).

The comparator $36_n$ compares a determination reference voltage $VR_n$ ($VR_n < VR_{n-1}$), which is based on the voltage difference between the input voltage Vin and the determination reference voltage VR and the amount of voltage drop caused by the resistor circuits $VR_1$, $VR_2$, . . . , and $VR_n$, with the detection voltage VC to generate a determination signal $OVC_n$ indicating whether or not the current Iin flowing to the first output transistor N1 is greater than or equal to a current amount $A_n$ ($A_n > A_{n-1}$).

Accordingly, the detection unit 22A detects multiple levels (i.e., n stages) of the current flowing to the output transistor N1 in. Thus, the detection unit 22A enables higher overcurrent protection than the detection unit 22 of FIG. 1. Although a plurality of reference current generation circuits are necessary in correspondence with the detection current levels in the prior art, the detection unit 22A of FIG. 3 performs multiple level detection using a single reference current generation circuit 14 (FIG. 1). This prevents the chip area from being enlarged and the power consumption from being increased.

Figure 4:
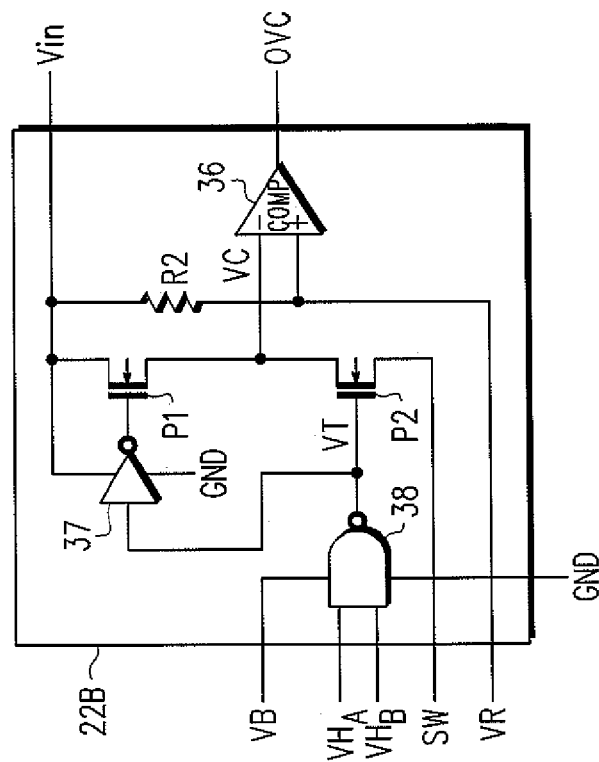
FIG. 4 is a schematic circuit diagram of a further detection unit.

FIG. 4 is a schematic circuit diagram showing a further detection unit 22B. The detection unit 22B may be used in place of the detection unit 22 of the DC-DC converter 12 of FIG. 1. In FIGS. 1 and 4, components denoted with the same reference numerals function in the same manner.

The detection unit 22B includes a comparator 36, an inverter 37, a NAND gate (logic gate) 38, a resistor circuit (current-voltage conversion circuit) R2, a pull-up circuit P1, and a switch circuit P2. The pull-up circuit P1 and the switch circuit P2 are each formed by a P-channel MOS transistor. The NAND gate 38 generates a timing signal VT based on the signals $VH_A$ and $VH_B$, and the transistor P2 (switch circuit) is activated and deactivated by the timing signal VT. The inverter 37 inverts the timing signal VT and provides the inverted signal to the gate of the transistor P1 (pull-up circuit). Therefore, the transistors P1 and P2 are activated in a complementary manner. The detection unit 22B operates in the same manner as the detection unit 22 of FIG. 1.

Figure 5:
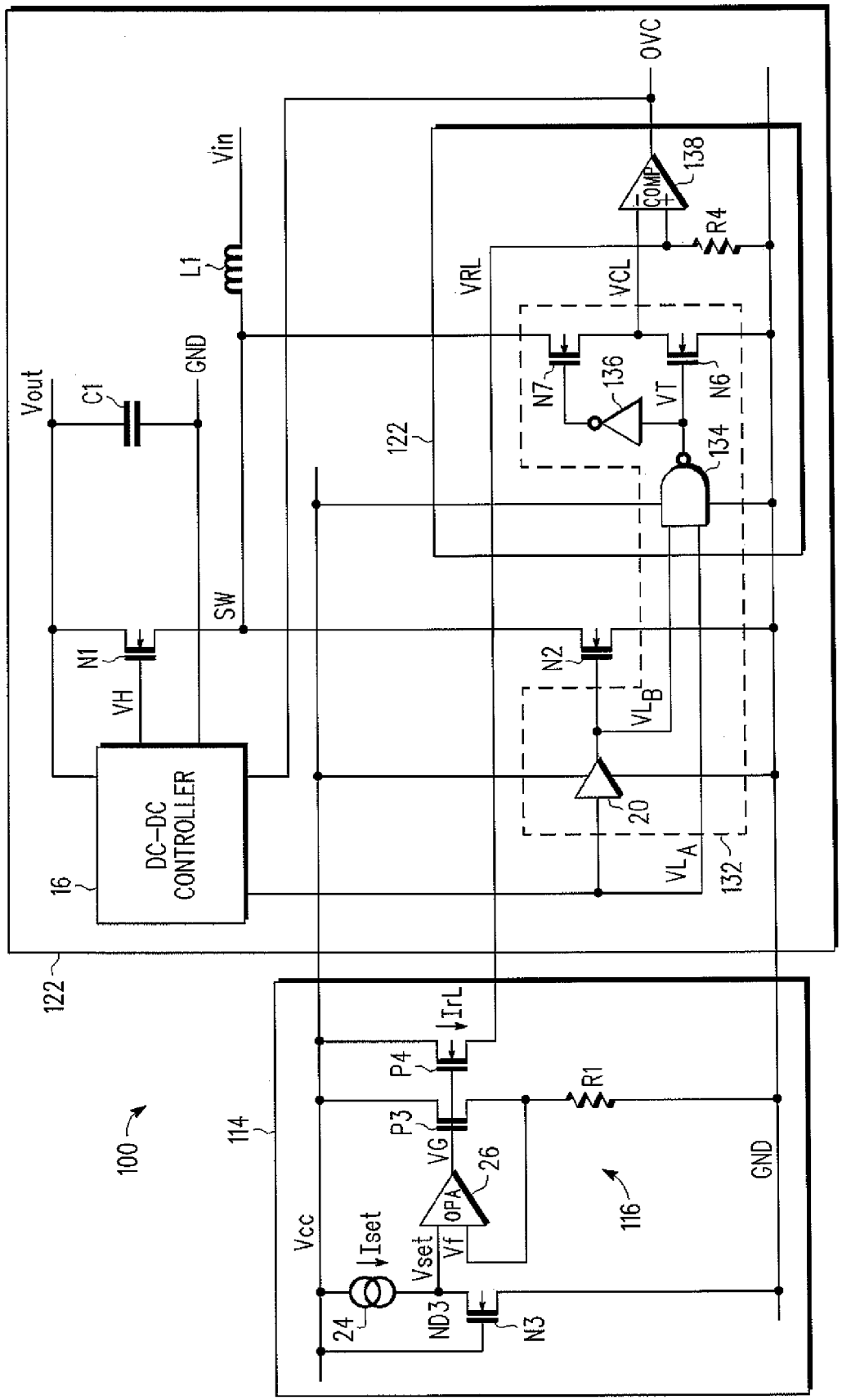
FIG. 5 is a schematic circuit diagram of an overcurrent detection circuit according to a further embodiment of the present invention.

FIG. 5 is a schematic circuit diagram of a power supply circuit 100 incorporating an overcurrent detection circuit according to another embodiment of the present invention. In FIGS. 1 and 5, components denoted with the same reference numerals function in the same manner.

The power supply circuit 100 includes a DC-DC converter 112 and a reference current generation circuit 114. The DC-DC converter 112 is a step-up DC-DC converter which generates an output voltage Vout higher than the input voltage Vin. The DC-DC converter 112 includes the first output transistor N1, the second output transistor N2, the DC-DC controller 16, the buffer (delay circuit) 20, and a detection unit 122. The overcurrent detection circuit of the power supply circuit 100 is formed by the reference current generation circuit 114, the buffer 20, and the detection unit 122. The detection unit 122 detects the overcurrent flowing to the second output transistor N2.

The reference current generation circuit 114 includes P-channel MOS transistors P3 and P4. The operation voltage Vcc is applied to the sources of the transistors P3 and P4. The control voltage VG generated by the operational amplifier 26 is supplied to the gates of the transistors P3 and P4. The drain of the transistor P3 is connected to the first resistor circuit R1, and the voltage at the node between the transistor P3 and the first transistor circuit R1 is supplied to the operational amplifier 26 as the feedback voltage Vf. The operational amplifier 26, the first resistor circuit R1, and the transistors P3 and P4 form a voltage-current conversion circuit 116. The reference current generation circuit 114 generates the determination reference current IrL at the drain of the transistor P4.

The detection unit 122 includes a NAND gate (logic gate) 134, an inverter 136, a pull-down circuit (voltage stabilizing circuit) N6, a switch circuit N7, a resistor circuit (current-voltage conversion circuit) R4, and a comparator (detector) 138. The NAND gate 134, the inverter 136, the pull-down circuit N6, the switch circuit N7, and the buffer 20 form a timing control circuit 132. The buffer 20 may be arranged in the DC-DC controller 16.

The NAND gate 134 generates the timing signal VT based on the drive signal $VL_A$, which is generated by the DC-DC controller 16, and the delayed drive signal $VL_B$, which is generated by delaying the drive signal. $VL_A$ with the buffer 20.

The pull-down circuit N6 and the switch circuit N7 are each formed by an N-channel MOS transistor. The source of the transistor N6 is connected to the ground GND, and the drain of the transistor N6 is connected to the source of the transistor N7. The voltage at the node SW is applied to the drain of the transistor N7. The timing signal VT is provided to the gate of the transistor N6, and an inverted timing signal generated by inverting the timing signal VT in the inverter 136 is provided to the gate of the transistor N7. Therefore, the transistors N6 and N7 are activated in a complementary manner. The voltage at the node between the transistors N6 and N7 is supplied to the non-inversion input terminal of the comparator 138 as a detection voltage VCL.

The resistor circuit R4 is formed by, for example, a resistor element. A first terminal of the resistor circuit R4 is connected to the ground GND, and a second terminal of the resistor circuit R4 is connected to the drain of the transistor P4. The node between the resistor circuit R4 and the transistor P4 is connected to the inversion input terminal of the comparator 138.

When the second output transistor N2 is activated by the delayed drive signal $VL_B$, the NAND gate 134 generates the timing signal VT having a low level to activate the transistor (switch circuit) N7. In this case, the transistor (pull-down circuit) N6 is deactivated by the timing signal VT having a low level. Therefore, the comparator 138 generates the determination signal OVC indicating whether or not the current flowing to the transistor N2 is greater than or equal to the overcurrent based on the determination reference voltage VRL and the detection voltage VCL corresponding to the potential at the node SW.

When the drive signal $VL_A$ falls from a high level to a low level, the NAND gate 134 generates the timing signal VT having a high level in response to the drive signal $VL_A$ having a low level. In response to the timing signal VT having a high level, the inverter 138 generates the inverted timing signal having a low level to deactivate the transistor (switch circuit) N7. After the transistor N7 is deactivated, the buffer 20 generates the delayed drive signal $VL_B$ having a low level to deactivate the second output transistor N2.

The transistor (pull-down circuit) N6 is activated by the timing signal VT having a high level when the transistor N7 is deactivated. Therefore, the detection voltage VCL is fixed at the ground level. The output signal (OVC) of the comparator 138 is thus maintained at a low level. Therefore, the overcurrent detection circuit (114, 20, and 122) shown in FIG. 5 has the same advantages as the overcurrent detection circuit (14, 20, and 22) shown in FIG. 1.

Figure 6:
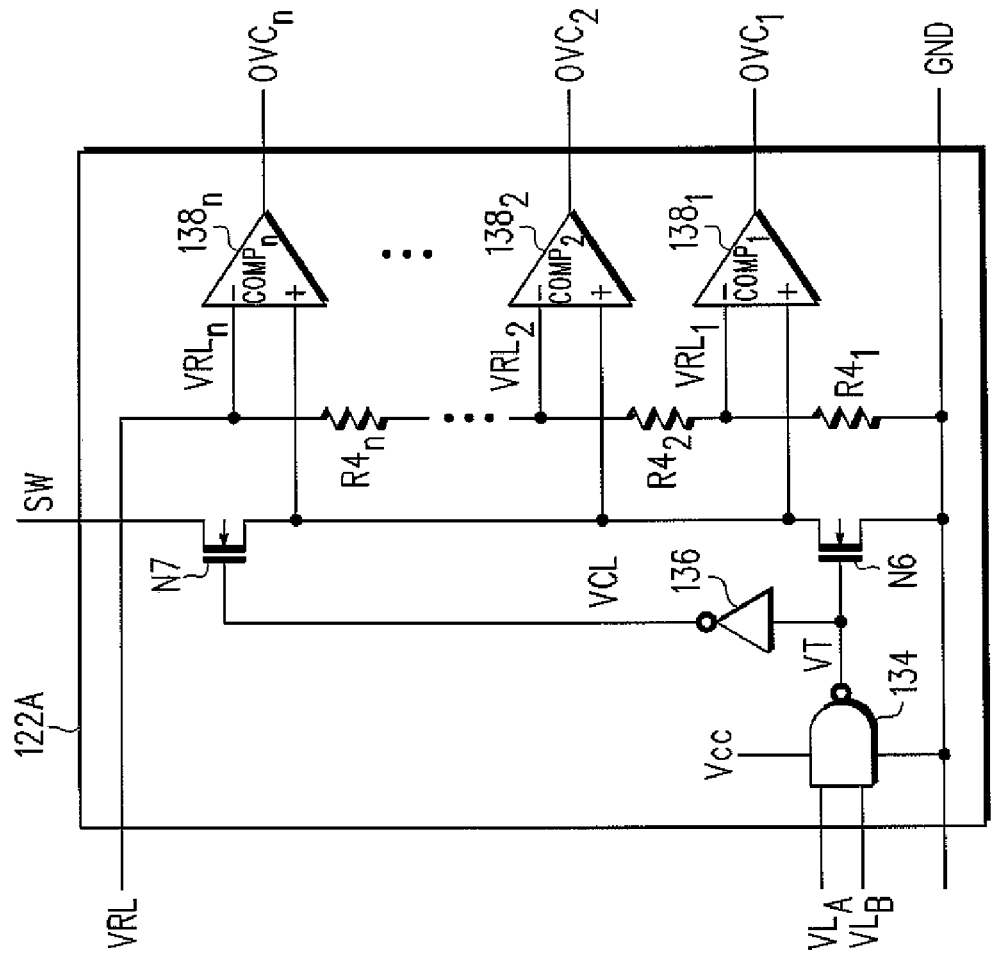
FIG. 6 is a schematic circuit diagram of another detection unit for detecting multiple levels of current flowing to a second output transistor in the overcurrent detection circuit of FIG. 5.

FIG. 6 is a schematic circuit diagram showing another detection unit 122A. The detection unit 122A may be used in place of the detection unit 122 of the DC-DC converter 112 of FIG. 5. In FIGS. 5 and 6, components denoted with the same reference numerals function in the same manner.

The detection unit 122A includes a plurality of resistor circuits (current-voltage conversion circuit) $R4_1$, $R4_2$, ..., and $R4_n$ and a plurality of comparators (detectors) $138_1$, $138_2$, ..., and $138_n$. The resistor circuits $R4_1$, $R4_2$, ..., $R4_n$ are connected in series and serve as voltage dividing circuits for dividing the voltage difference between the determination reference voltage VRL and ground GND to generate a plurality of determination reference voltages $VRL_1$, $VRL_2$, ..., and $VRL_n$. The resistor circuits $R4_1$, $R4_2$, ..., and $R4_n$ are each formed by, for example, a resistor element.

The comparator $138_1$ compares a determination reference voltage $VRL_1$ and the detection voltage VCL to generate a determination signal $OVC_1$ indicating whether or not the current flowing to the second output transistor N2 (FIG. 5) is greater than or equal to a current amount $AL_1$.

The comparator $138_2$ compares a determination reference voltage $VR_2$ ($VRL_2 > VRL_1$) and the detection voltage VCL to generate a determination signal $OVC_2$ indicating whether or not the current flowing to the second output transistor N2 is, greater than or equal to a current amount $AL_2$ ($AL_2 > AL_1$).

The comparator $138_n$ compares a determination reference voltage $VRL_n$ ($VRL_n > VRL_{n-1}$) and the detection voltage VCL to generate a determination signal $OVC_n$ indicating whether or not the current flowing to the second output transistor N2 is greater than or equal to a current amount $A_n$ ($A_n > A_{n-1}$).

Accordingly, the detection unit 122A detects the current flowing to the second output transistor N2 in multiple levels (i.e., n stages). The detection unit 122A performs multiple level detection using a single reference current generation circuit 114 (FIG. 1). This prevents the chip area from being enlarged and the power consumption from being increased.

Figure 7:
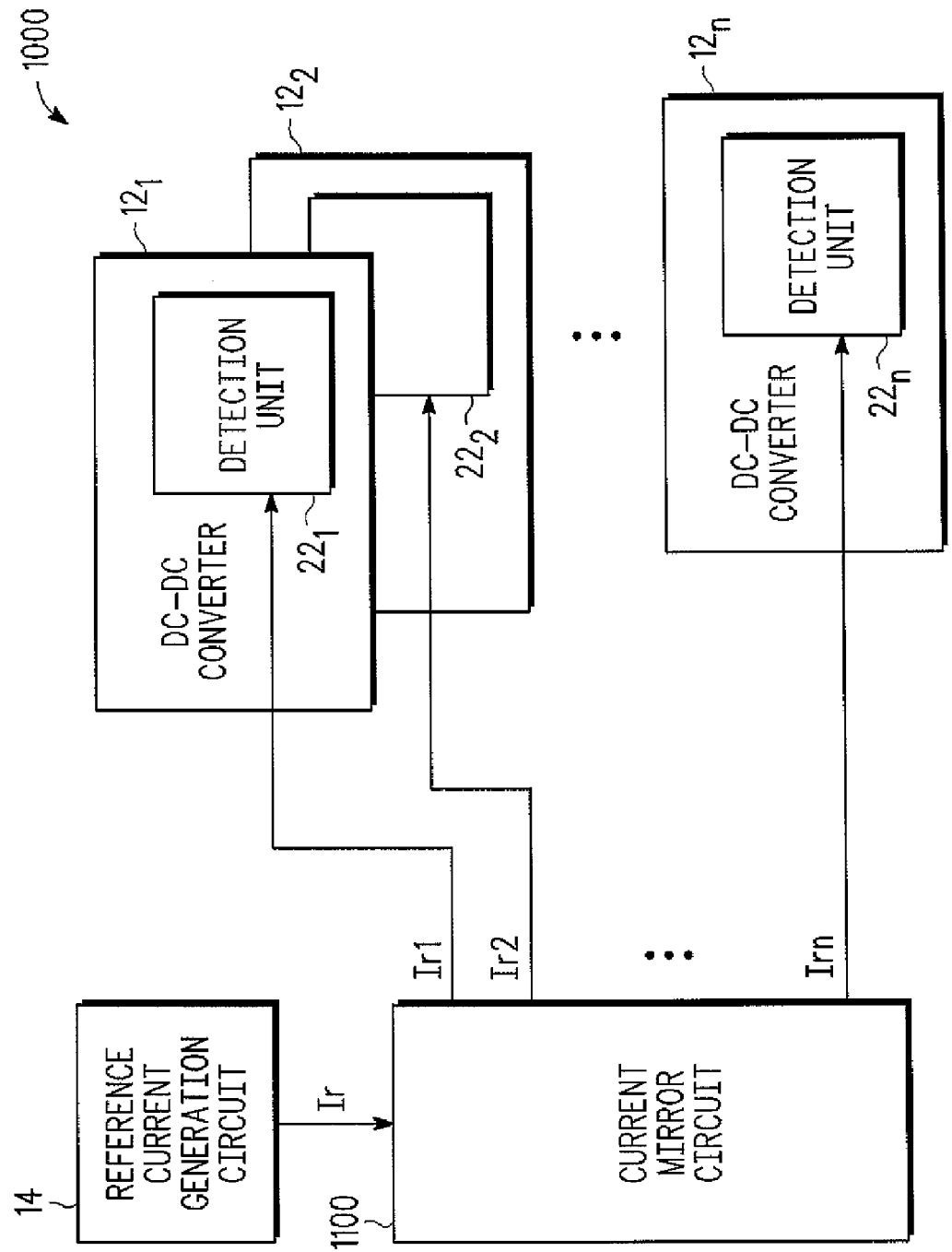
FIG. 7 is a schematic block circuit diagram of a multichannel DC-DC converter.

FIG. 7 is a schematic circuit diagram of a multichannel DC-DC converter 1000.

A multichannel DC-DC converter 1000 includes the reference current generation circuit 14 (FIG. 1), a current mirror circuit 1100, and a plurality of DC-DC converters (hereinafter referred to as "DDCs") $12_1$, $12_2$, ..., and $12_n$. The DDCs $12_1$, $12_2$, ..., and $12_n$ respectively includes detection units $22_1$, $22_2$, ..., and $22_n$. The DDCs $12_1$, $12_2$, ..., $12_n$ may be a step-up DDC, a step-down DDC, or a step-up-step-down DDC.

The current mirror circuit 1100, which has a known current mirror configuration, generates a plurality of determination reference currents $Ir_1$, $Ir_2$, ..., and $Ir_n$, which are proportional to the determination reference current Ir generated by the reference current generation circuit 14. In this case, the currents $Ir_1$, $Ir_2$, ..., and $Ir_n$ may be the same as the current Ir or may be changed in accordance with the level of the detecting overcurrent Iovc.

The detection units $22_1$, $22_2$, ..., and $22_n$ are each formed in the same manner as the detection unit 22 shown in FIG. 1, the detection unit 22A shown in FIG. 3, the detection unit 22B shown in FIG. 4, the detection unit 122 shown in FIG. 5, or the detection unit 122A shown in FIG. 6. The detection units $22_1$, $22_2$, ..., and $22_n$ each generate the determination reference voltage corresponding to the level of the overcurrent detected at each DDC based on one of the determination reference currents $Ir_1$, $Ir_2$, ..., and $Ir_n$. Further, the detection units $22_1$, $22_2$, ..., and $22_n$ each detect the overcurrent flowing to the output transistor of each DDC using the determination reference voltage.

The multichannel DC-DC converter 1000 detects the different overcurrent levels in the plurality of DDCs $12_1$, $12_2, \ldots,$ and $12_n$ based on the determination reference current Ir generated by the single reference current generation circuit 14. This significantly reduces the chip area and power consumption.

It should be apparent to those skilled in the art that the present invention may be embodied in many other specific forms without departing from the spirit or scope of the invention. Particularly, it should be understood that the present invention may be embodied in the following forms.

The overcurrent detection circuit is not limited to the step-down DC-DC converter (FIG. 1) or the step-up DC-DC converter (FIG. 5) and may be applied to a step-up-step-down converter. In this case, the overcurrent detection circuit suitably detects the overcurrent flowing to the first output transistor N1 and the overcurrent flowing to the second output transistor N2. In such overcurrent detection circuit, the reference current generation circuit is formed by adding the transistors P3 and P4 shown in FIG. 5 to the reference current generation circuit 14 shown in FIG. 1. A step-up-step-down converter includes both the detection unit 22 shown in FIG. 1 and the detection unit 122 shown in FIG. 5.

The present examples and embodiments are to be considered as illustrative and not restrictive, and the invention is not to be limited to the details given herein, but may be modified within the scope and equivalence of the appended claims.

What is claimed is:

1. An overcurrent detection circuit for detecting overcurrent flowing to an output transistor, the overcurrent detection circuit comprising:
    a constant current circuit for generating a reference current;
    a replica transistor, connected to the constant current circuit, for generating a reference voltage that is in accordance with the reference current;
    a voltage-current conversion circuit, connected to the constant current circuit and the replica transistor, for generating a determination reference current that is proportional to the reference current based on the reference voltage;
    a current-voltage conversion circuit, connected to the voltage-current conversion circuit, for converting the determination reference current to a determination reference voltage; and
    a detector, connected to the current-voltage conversion circuit, for detecting the overcurrent flowing to the output transistor based on the determination reference voltage.

2. The overcurrent detection circuit of claim 1, wherein the determination reference current is smaller than the overcurrent detected by the detector.

3. The overcurrent detection circuit of claim 1, wherein:
    the output transistor is of a predetermined conductance type and has a predetermined size; and
    the replica transistor has the same conductance type as the output transistor and is smaller than the output transistor.

4. The overcurrent detection circuit of claim 3, wherein:
    the output transistor has a first element size;
    the replica transistor has a second element size;
    the voltage-current conversion circuit includes a first resistor circuit having a first resistance;
    the current-voltage conversion circuit includes a second resistor circuit having a second resistance; and
    the determination reference voltage is determined by the first element size, the second element size, the first resistance, the second resistance, and the reference current.

5. The overcurrent detection circuit of claim 1, further comprising:
    a timing control circuit, connected to the output transistor and the detector, for controlling the timing for supplying the detector with a detection voltage corresponding to the current flowing to the output transistor.

6. The overcurrent detection circuit according to claim 5, wherein the timing control circuit supplies the detector with the detection voltage corresponding to the current flowing to the output transistor when the output transistor is activated.

7. The overcurrent detection circuit of claim 6, wherein the timing control circuit fixes the detection voltage at a predetermined level when the output transistor is deactivated.

8. The overcurrent detection circuit of claim 5, wherein the timing control circuit includes:
    a delay circuit for delaying a drive signal that drives the output transistor and generating a delayed drive signal;
    a logic gate, connected to the delay circuit, for performing a logical operation on the drive signal and the delayed drive signal to generate a timing signal; and
    a switch circuit, connected to the output transistor, the logic gate, and the detector, for supplying the detector with the detection voltage in response to the timing signal.

9. The overcurrent detection circuit of claim 8, wherein the timing control circuit further includes:
    a voltage stabilizing circuit connected to the switch circuit and the detector.

10. The overcurrent detection circuit of claim 9, wherein the voltage stabilizing circuit is a pull-up circuit or a pull-down circuit.

11. The overcurrent detection circuit of claim 1, wherein:
    the voltage-current conversion circuit includes:
        an operational amplifier for generating a control voltage based on the reference voltage and a feedback voltage;
        a current control transistor connected to the operational amplifier and driven by the control voltage; and
        a first resistor circuit connected to the operational amplifier and the current control transistor, the feedback voltage being generated at a node between the current control transistor and the first resistor circuit; and
    the determination reference current flows through the current control transistor and the first resistor circuit.

12. The overcurrent detection circuit of claim 1, further comprising:
    a second current-voltage conversion circuit, connected to the voltage-current conversion circuit and the current-voltage conversion circuit, for generating a second determination reference voltage based on the determination reference voltage; and
    a second detector, connected to the second current-voltage conversion circuit, for detecting an overcurrent flowing to the output transistor based on the second determination reference voltage, wherein the first detector detects a first overcurrent flowing to the output transistor, and the second detector detects a second overcurrent flowing to the output transistor.

13. A power supply circuit comprising:
    a first side transistor;
    a second side transistor connected in series to the first side transistor;
    a DC-DC controller for generating first and second drive signals that drive the first and second side transistors in a complementary manner;
    a constant current circuit for generating a reference current;

a replica transistor, connected to the constant current circuit, for generating a reference voltage that is in accordance with the reference current;
a voltage-current conversion circuit, connected to the constant current circuit and the replica transistor, for generating a determination reference current proportional to the reference current based on the reference voltage;
a first side current-voltage conversion circuit, connected to the voltage-current conversion circuit, for converting the determination reference current to a first side reference voltage; and
a first side detector, connected to the first side current-voltage conversion circuit, for detecting current flowing to the first side transistor based on the first side reference voltage.

14. The power supply circuit of claim 13, further comprising:
a first timing control circuit, connected to the first side transistor and the first side detector, for controlling the timing for supplying the first side detector with a first detection voltage corresponding to the current flowing to the first side transistor.

15. The power supply circuit of claim 14, further comprising:
a second side current-voltage conversion circuit, connected to the voltage-current conversion circuit, for converting the determination reference current to a second side reference voltage; and
a second side detector, connected to the second side current-voltage conversion circuit, for detecting overcurrent flowing to the second side transistor based on the second side reference voltage.

16. The power supply circuit of claim 15, wherein:
the first side transistor and the second side transistor each have a predetermined conductance type and a predetermined size; and
the replica transistor has the same conductance type as the first and second side transistors and is smaller than the first and second transistors.

17. The power supply circuit of claim 15, further comprising:
a second timing control circuit, connected to the second side transistor and the second side detector, for controlling the timing for supplying the second side detector with a second detection voltage corresponding to the current flowing to the second side transistor.

18. A multi-channel DC-DC converter comprising:
a reference current generation circuit for generating a determination reference current;
a current mirror circuit, connected to the reference current generation circuit, for generating a plurality of determination reference currents proportional to the determination reference current; and
a plurality of DC-DC converters connected to the current mirror circuit;
wherein the reference current generation circuit includes:
a constant current circuit for generating a reference current;
a replica transistor, connected to the constant current circuit, for generating a reference voltage that is in accordance with the reference current; and
a voltage-current conversion circuit, connected to the constant current circuit and the replica transistor, for generating the determination reference current that is proportional to the reference current based on the reference voltage; and
wherein the plurality of DC-DC converters each include:
an output transistor; and
a detection unit for detecting current flowing to the output transistor, the detection unit including:
a current-voltage conversion circuit, connected to the current mirror circuit, for converting one of the plurality of determination reference currents to a determination reference voltage; and
a detector, connected to the current-voltage conversion circuit, for detecting overcurrent flowing to the output transistor based on the determination reference voltage.

* * * * *